(12) United States Patent
Rodder et al.

(10) Patent No.: US 7,560,779 B2
(45) Date of Patent: Jul. 14, 2009

(54) METHOD FOR FORMING A MIXED VOLTAGE CIRCUIT HAVING COMPLEMENTARY DEVICES

(75) Inventors: Mark S. Rodder, University Park, TX (US); Jarvis B. Jacobs, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 845 days.

(21) Appl. No.: 10/426,454

(22) Filed: Apr. 29, 2003

(65) Prior Publication Data

US 2003/0199133 A1    Oct. 23, 2003

Related U.S. Application Data

(62) Division of application No. 09/452,037, filed on Nov. 30, 1999, now Pat. No. 6,583,013.

(51) Int. Cl.
    *H01L 27/088* (2006.01)
(52) U.S. Cl. .................. 257/369; 257/371; 257/392; 257/E27.064
(58) Field of Classification Search ............ 257/392, 257/369, 371, 355, 356, 357
    See application file for complete search history.

(56) References Cited

U.S. PATENT DOCUMENTS

| 4,907,058 | A | * | 3/1990 | Sakai | ................ 257/371 |
| 5,527,722 | A | * | 6/1996 | Hutter et al. | ................ 438/231 |
| 5,618,740 | A | * | 4/1997 | Huang | ................ 438/224 |
| 5,917,218 | A | * | 6/1999 | Choi et al. | ................ 257/345 |
| 6,017,797 | A | * | 1/2000 | Furukawa | ................ 438/275 |
| 6,043,128 | A | * | 3/2000 | Kamiya | ................ 438/289 |

* cited by examiner

*Primary Examiner*—Michael Trinh
(74) *Attorney, Agent, or Firm*—Jacqueline J. Garner; Wade J. Brady, III; Frederick J. Telecky, Jr.

(57) ABSTRACT

A mixed voltage circuit is formed by providing a substrate (12) having a first region (20) for forming a first device (106), a second region (22) for forming a second device (108) complementary to the first device (106), and a third region (24) for forming a third device (110) that operates at a different voltage than the first device (106). A gate layer (50) is formed outwardly of the first, second, and third regions (20, 22, 24). While maintaining a substantially uniform concentration of a dopant type (51) in the gate layer (50), a first gate electrode (56) is formed in the first region (20), a second gate electrode (58) is formed in the second region (22), and a third gate electrode (60) is formed in the third region (24). The third region (24) is protected while implanting dopants (72) into the first region (20) to form source and drain features (74) for the first device (106). The first region (20) is protected while implanting dopants (82) into the third region (24) to form disparate source and drain features (84) for the third device (110).

7 Claims, 3 Drawing Sheets

METHOD FOR FORMING A MIXED VOLTAGE CIRCUIT HAVING COMPLEMENTARY DEVICES

CROSS-REFERENCE TO RELATED APPLICATIONS

This application is a Division of Ser. No. 09/452,037 filed Nov. 30, 1999, U.S. Pat. No. 6,583,013.

TECHNICAL FIELD OF THE INVENTION

This invention relates generally to the field of integrated circuits, and more particularly to an improved method for forming a mixed voltage circuit having complementary devices.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. The integrated circuit may be a mixed voltage circuit that has core devices which operate at low voltage to accommodate small device size and to minimize power consumption and heat generation, and input/output (I/O) devices which operate at a higher voltage to interface with other higher voltage devices.

For a complementary metal oxide semiconductor (CMOS) mixed voltage circuit, the core devices are typically field effect transistors with a thin gate dielectric and a low threshold voltage while the I/O devices are typically field effect transistors with a thick dielectric and a high threshold voltage. To optimize performance of both core and I/O devices, masking processes in addition to roadmap CMOS design have been used to provide the dual gate dielectric thickness and to separately form source and drain extensions and pockets for the core and I/O devices. Such additional masking processes are expensive and greatly increase the cost of CMOS mixed voltage circuits.

Efforts to reduce the cost of CMOS mixed voltage circuits have concentrated on minimizing masking processes by co-optimizing the formation of source and drain extensions and pockets for the core and I/O devices using a single masking process. Co-optimization approaches, however, typically fail to achieve high performance core devices because the graded or deeper junctions required for I/O device reliability severely degrades the drive current performance of the core devices.

SUMMARY OF THE INVENTION

In accordance with the present invention, a method for forming a mixed voltage circuit having complementary devices is provided that substantially eliminates or reduces disadvantages or problems associated with previously developed systems and methods. In particular, the present invention provides a low cost mixed voltage circuit with improved device performance.

In one embodiment of the present invention, a mixed voltage circuit is formed by providing a substrate having a first region for forming a first device, a second region for forming a second device complementary to the first device, and a third region for forming a third device that operates at a different voltage than the first device. A gate layer is formed outwardly of the first, second, and third regions. While maintaining a substantially uniform concentration of a dopant type in the gate layer, a first gate electrode is formed in the first region, a second gate electrode is formed in the second region, and a third gate electrode is formed in the third region. The third region is protected while implanting dopants into the first region to form source and drain features for the first device. The first region is protected while implanting dopants into the third region to form disparate source and drain features for the third device.

Technical advantages of the present invention include providing an improved method for forming a mixed voltage circuit. In particular, performance of the mixed voltage devices in the circuit is improved without increasing fabrication costs. This is accomplished by omitting a gate implant mask from the fabrication process and instead using separate masks to optimize source and drain features for the low voltage core devices and higher voltage input/output (I/O) devices. The resulting mixed voltage circuit has high I/O device reliability and low core device resistance.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

Figure 1A:
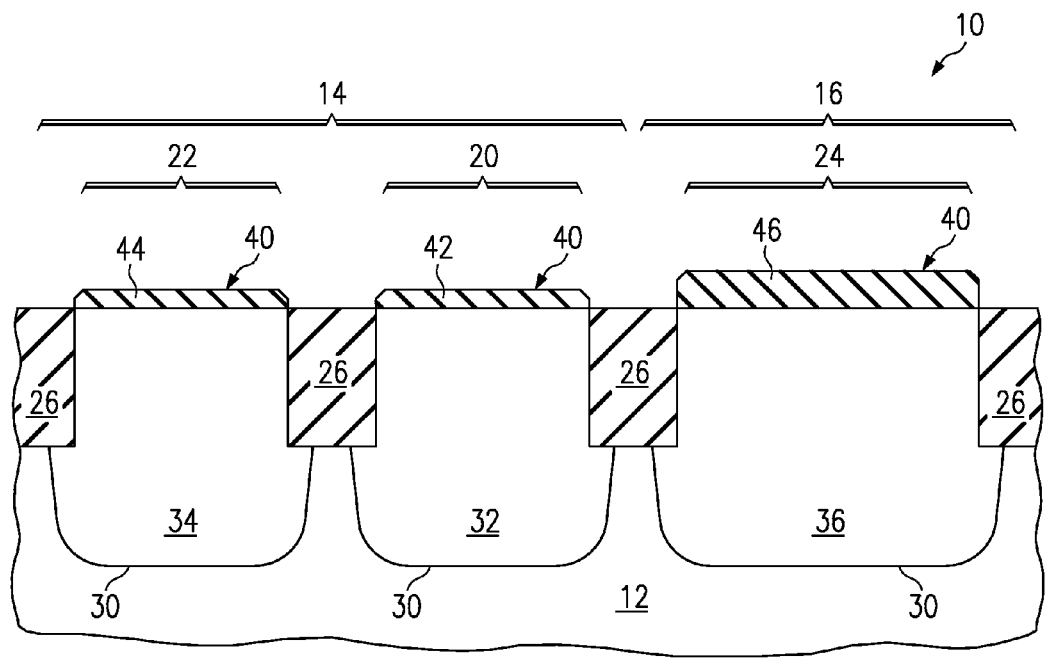
FIGS. 1A-F are a series of schematic cross-sectional diagrams illustrating fabrication of a mixed voltage circuit having complementary devices in accordance with one embodiment of the present invention.

FIGS. 1A-F illustrate fabrication of a mixed voltage circuit having complementary devices in accordance with one embodiment of the present invention. Referring to FIG. 1A, an initial structure 10 for the mixed voltage circuit includes a substrate 12 having a core section 14 and an input/output section 16. As described in more detail below, devices in the core section 14 operate at a low voltage to accommodate small device size and to minimize power consumption and heat generation. Devices in the input/output section 16 operate at a higher voltage than the core devices to interface the core devices with higher voltage circuits.

The substrate 12 comprises a semiconductor material such as single-crystalline silicon. The substrate 12 is a semiconductor wafer, an epitaxial layer grown on a wafer, a semiconductor on insulation (SOI) system or other types of materials. The substrate 12 may include previously formed active devices (not shown) such as transistors, capacitors, resistors and the like. Accordingly, the core and input/output devices may be constructed in the midst of other active devices as long as the core and input/output devices are suitably isolated from the other devices.

The substrate 12 is isolated into the core and input/output sections 14 and 16, and into first and second regions 20 and 22 in the core section 14 and into a third region 24 in the input/output section 16 by isolation structures 26. The labels "first", "second", and "third" are used to distinguish between the regions 20, 22, and 24 of the substrate 12 and not to specify a particular location or order for the regions 20, 22, and 24 on the substrate 12. Thus, the regions 20, 22, and 24 may be in other or different sections of the substrate 12.

The isolation structures 26 may be independent structures, part of a unitary structure or a combination of independent and unitary structures. For sub-micron applications, the isolation structures 26 are preferably shallow trench isolation (STI) structures conventionally formed by etching a trench into the substrate 12 and filling the trench with a suitable dielectric material such as oxide. It will be understood that the core and input/output sections 14 and 16 and the regions 20, 22 and 24 may be otherwise suitably isolated from each other. For example, the core and input/output sections 14 and 16 may be generally isolated form each other by a field oxide and separated by an extended distance associated with field oxide formation.

As described in more detail below, a first device is formed in the first region 20, a second device is formed in the second region 22, and a third device is formed in the third region 24. The first and second devices are core devices and complementary to each other in that they have different dopant profiles. The dopant profiles differ in dopant type, such as n-type and p-type, dopant concentration, dopant structure, or other suitable characteristic. The third device is an input/output device that operates at a different voltage than the first device. The first and third devices operate at different voltage in that they have disparate threshold voltages, supply voltages, or other suitable voltage differences.

For the embodiment of FIGS. 1A-F, both the core and the input/output devices are metal oxide semiconductor field effect transistors (MOSFET) of a deep sub-micron gate length. In an exemplary embodiment, the first device is an nMOSFET that operates based on a supply voltage of about 1.5 volts, the second device is a complementary pMOSFET that also operates based on the supply voltage of about 1.5 volts, and the third device is an nMOSFET that operates based on a supply voltage of about 3.3 volts. It will be understood that the mixed voltage circuit may include other or different devices in the core and input/output sections 14 and 16. For example, the mixed voltage circuit may include pMOSFET devices in the input/output section 16.

Each region 20, 22, and 24 includes a well 30 formed in the substrate 12 to control channel characteristics for the device of that region. Thus, for the exemplary MOSFET embodiment, the first region 20 includes a p-well 32 for the low voltage nMOS transistor, the second region 22 includes an n-well 34 for the low voltage pMOS transistor, and the third region 24 includes a p-well 36 for the higher voltage nMOS transistor. The p-wells 32 and 36 are formed by conventionally doping the semiconductor material of a substrate 12 with a p-type dopant such as boron. The n-type well 34 is conventionally formed by doping the semiconductor material of the substrate 12 with an n-type dopant such as phosphorus, arsenic, or antimony.

In addition to well dopants, the substrate 12 may include threshold-voltage adjust and punch through dopants. The well, threshold-voltage adjust and punch through dopants are implanted into the substrate 12 and annealed in accordance with conventional integrated circuit processing techniques. Following the anneal, a screen oxide may be grown and stripped to remove impurities from the surface of the substrate 12 in preparation for gate formation.

Each region 20, 22, and 24 includes a gate dielectric 40 formed outwardly of the substrate 12. For the exemplary MOSFET embodiment, first and second gate dielectrics 42 and 44 for the core devices comprise oxide conventionally grown to a thickness of about 30 to 40 angstroms. A third gate electrode 46 for the input/output device comprises oxide conventionally grown to a thickness of about 70 to 80 angstroms. The thicker oxide of the input/output device accommodates the higher voltage of the device.

The dual gate oxide may be formed by growing a first oxide layer over both the core and the input/output sections 14 and 16, patterning and etching the first oxide layer to remove it from the core section 14, and forming a second oxide layer over both the core and the input/output sections 14 and 16. In this embodiment, the first oxide layer has a thickness of about 50 to 60 angstroms and the second oxide layer has a thickness of about 30 to 40 angstroms. Accordingly, the third gate dielectric 46 is formed from both the first and the second oxide layers and has a cumulative thickness of about 70 to 80 angstroms. The first and second gate dielectrics 42 and 44 are formed from only the second oxide layer and have a thickness of about 30 to 40 angstroms. In this way, the dual gate dielectrics are formed using only a single mask and etch process in addition to CMOS roadmap. CMOS roadmap represents the standard processing steps used to form CMOS transistors.

Figure 1B:
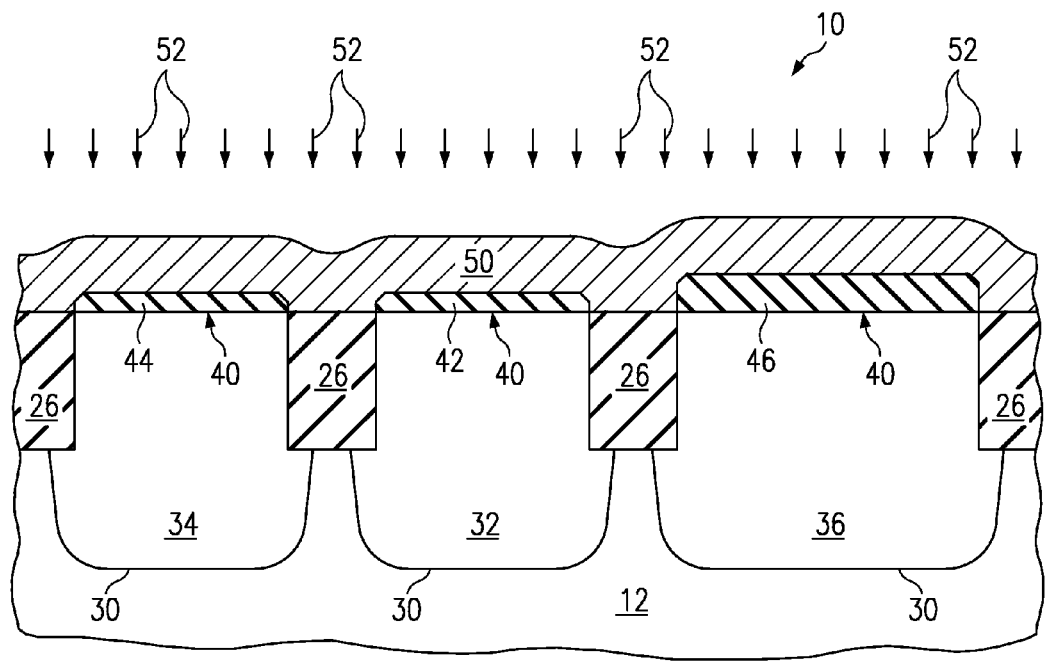

Referring to FIG. 1B, a gate layer 50 is formed outwardly of the gate dielectrics 40. As described in more detail below, the gate layer 50 is patterned and etched to form gate electrodes for the core and input/output devices of the mixed voltage circuit. For the exemplary MOSFET embodiment, the gate layer 50 comprises polysilicon conventionally deposited to a depth of about 2500 angstroms.

In contrast to roadmap CMOS that mask pMOS areas of the gate layer 50 (areas from which gate electrodes for pMOS devices are formed) to allow an nMOS gate implant into NMOS areas of the gate layer 50 (areas from which gate electrodes for nMOS devices are formed) to reduce poly depletion in the NMOS gates, the present invention maintains a substantially uniform concentration of an n-type dopant or dopants in the gate layer 50. As a result, a mask process is omitted at this stage of the CMOS fabrication process as compared to roadmap CMOS and instead used later in the fabrication process to individually optimize source and drain features for both the core and input/output devices by using separate mask processes. In this way, performance of the mixed voltage circuit is significantly improved without increasing mask processes, and thus production costs. Gate doping based on gate dopants added in connection with forming the gates may be altered by other dopants implanted in connection with forming other features of the device such as source and drains.

More particularly, nMOS input/output devices are only slightly affected by the loss of the nMOS gate implant because poly depletion is not a significant issue at thick gate oxide. The nMOS core devices are affected more by poly depletion which can lead to a reduction in gate capacitance. This reduction in capacitance, however, will not degrade the device performance significantly because the resistance of the source and drain can be minimized by the individually optimized source and drain features. In addition, individual optimization of the source and drain features for both the core and input/output devices results in significantly improved performance and reliability for the core and input/output devices compared to devices having co-optimized source and drain features formed using only a single mask as in roadmap CMOS. Thus, by using a mask process to individually optimize source and drain features rather than perform an nMOS gate implant, performance of the mixed voltage circuit is significantly improved without additional production cost.

For the embodiment of FIG. 1B, the n-type dopant concentration is uniformly maintained in the gate layer 50 by blanketly implanting the n-type dopants 51 into the gate layer 50. In this embodiment, the n-type dopant is preferably implanted to a concentration sufficient to enable line width measurements of nMOS gate electrodes after gate etch while not appreciably affecting pMOS net gate doping. For a phosphorus n-type dopant, the phosphorus concentration in the gate layer 50 is preferably about $6E14/CM^3$ which will enable nMOS line width measurements without appreciably affecting pMOS net gate doping. The phosphorus concentration may be diminished in the gate layer 50 to reduce pMOS gate effects. A consequence of this is to also reduce the ability to make nMOS line width measurements. In another embodiment, for example, the uniform concentration of n-type dopants is maintained by omitting n-type dopants from the gate layer 50. This eliminates adverse pMOS gate effects at the cost of preventing nMOS line width measurements after gate etch.

Figure 1C:
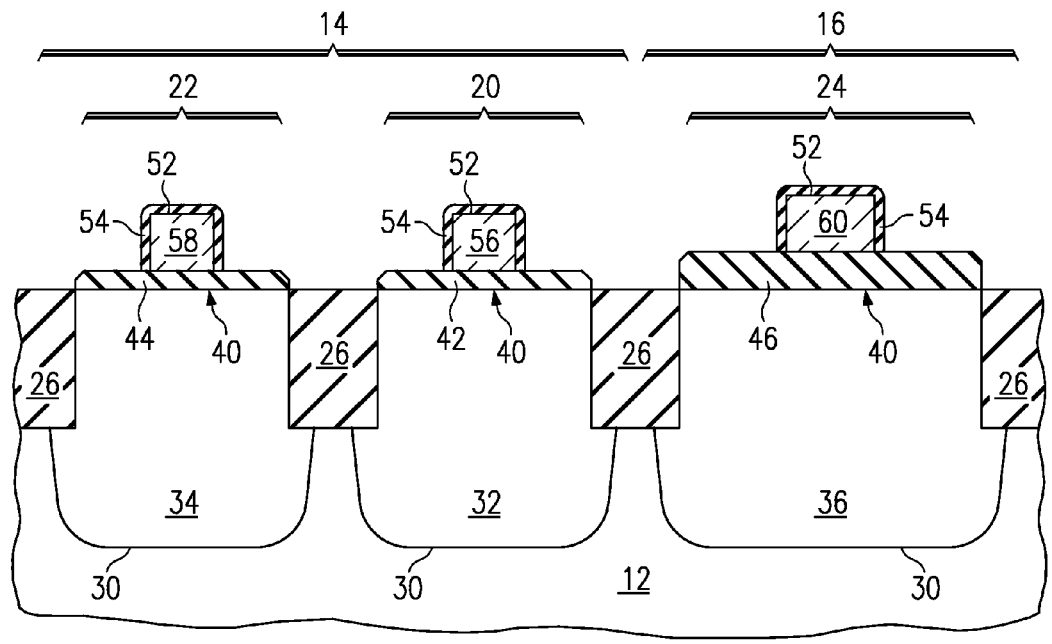

Referring to FIG. 1C, the gate layer 50 is conventionally patterned and etched to form gate electrodes 52 outwardly of the gate dielectrics 40. The gate etch is preferably highly selective between the material of the gate layer 50 and the material of the gate dielectrics 40 to minimize etch damage to the gate dielectrics 40. After the gate etch, a poly reoxidation layer 54 is conventionally formed outwardly of the gate electrodes 52 to repair etch damage.

For the exemplary MOSFET embodiment, the gate electrode 52 formed in the first region 20 is an nMOS gate 56, the gate electrode 52 formed in the second region 22 is a pMOS gate 58, and the gate electrode 52 formed in the third region 24 is an nMOS gate 60. The nMOS and pMOS gates 56 and 58 for the core devices have a gate length of about 0.15 microns while the nMOS gate 60 for the input/output device has a gate length of about 0.35 microns. The longer gate length of the input/output device accommodates the higher voltage of the device.

Figure 1D:
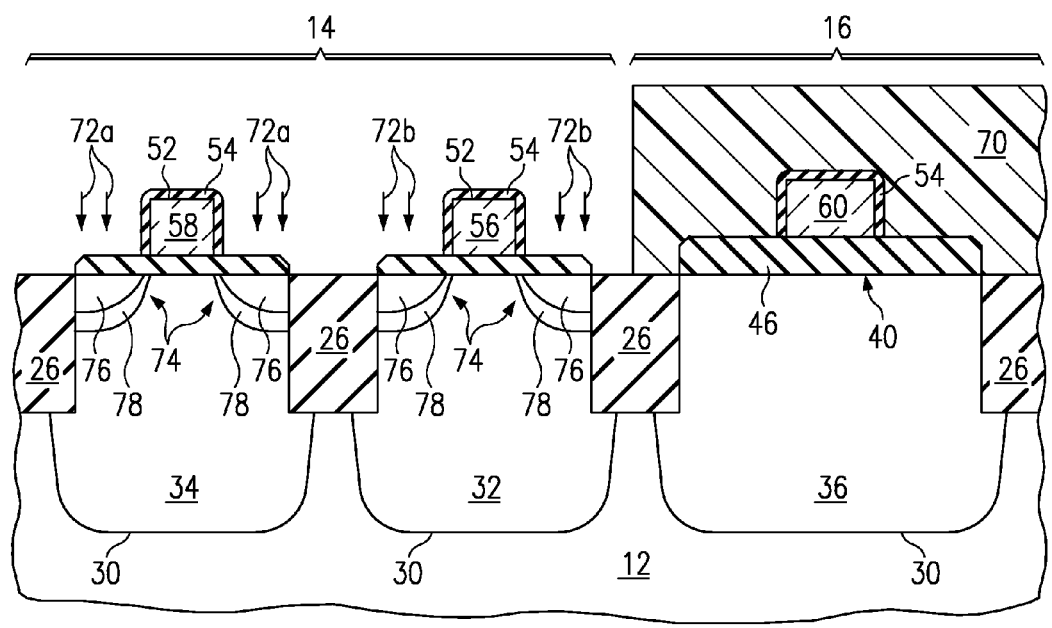

Referring to FIG. 1D, the input/output section 16 is protected by a mask 70 while dopants 72 are implanted into the core section 14 to form source and drain features 74 for the core devices. Accordingly, the source and drain features 74 may be optimized for the core devices without regard to the input/output device. As a result, performance of the core devices is improved without degrading input/output device performance.

The mask 70 is a conventional photolithographic mask formed by patterning and developing a resist layer to expose the core section 14 while covering the input/output section 16. The thickness of the mask 70 may be varied to that needed to protect the input/output section 16 from implantation of the core dopants 72. After core dopant implantation is completed, the mask 70 is conventionally removed.

For the exemplary MOSFET embodiment, separate masks are used to form source and drain features for the nMOS and the pMOS devices. Thus, disparate dopants 72a and 72b are used for the nMOS and the pMOS devices. In this embodiment, a pMOS mask covers the nMOS devices and the input/output section 16 during dopant 72a implantation. After doping, the pMOS mask is removed and an nMOS mask is formed covering the pMOS devices and the input/output section 16 during dopant 72b implantation. Thus, mask 70 is formed from separate masking processes.

The core source and drain features 74 comprise source and drain extensions 76 and pockets 78. The extensions 76 extend later formed source and drains to compensate for short channels of the core devices. For the nMOS device, the extensions 76 are formed by doping arsenic to a concentration of about $5E14/CM^3$ to $1E15/CM^3$ at an energy of about 10 to 15 KeV. The pockets 78 are used in connection with the extensions 76 to reduce gate length sensitivity to drive current. The pockets 78 are formed by doping boron to a concentration of about $2E17/CM^3$ to $2E18/CM^3$ at an energy of about 10 to 25 KeV. For the pMOS device, the extensions 76 are formed by doping boron at a suitable energy and to a suitable concentration. The pockets 78 are formed by doping phosphorus at a suitable energy and to a suitable concentration. The source and drain features 74 may be otherwise formed with other or different dopants, dopant structures, dopant implantation energies or concentrations, or other attributes as needed to optimize performance of the core devices.

Figure 1E:
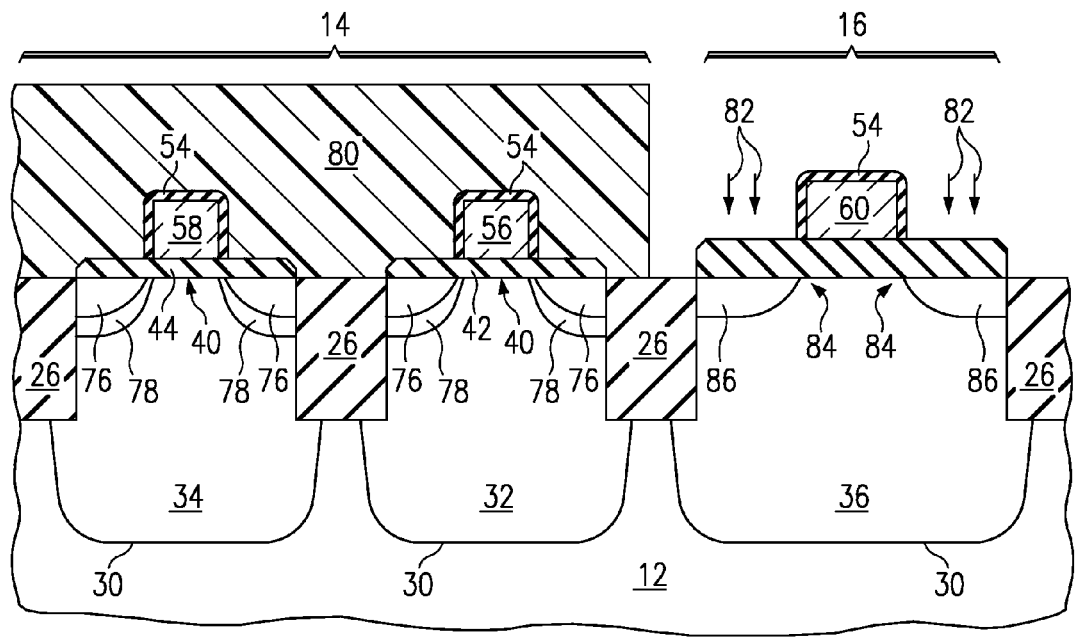

Referring to FIG. 1E, the core section 14 is protected by a mask 80 while dopants 82 are implanted into the input/output section 16 to form source and drain features 84 for the input/output device. Accordingly, the source and drain features 84 may be optimized for the input/output device without regard to the core devices. As a result, performance of the input/output device is improved without degrading core device performance.

The mask 80 is a conventional photolithographic mask formed by depositing, patterning and etching a resist layer to expose the input/output section 16 while covering the core section 14. The thickness of the mask 80 may be varied to that needed to protect the core section 14 from implantation of the input/output dopants 82. After input/output dopant implantation is completed, the mask 80 is conventionally removed.

For the exemplary MOSFET embodiment, the input/output source and drain features 84 comprise source and drain extensions 86. The extensions 86 extend later formed source and drains to compensate for short channels of the input/output devices. The extensions 86 are formed by dopanting arsenic to a concentration of about $1E18/CM^3$ to $5E19/CM^3$ at an energy of about 50 to 100 KeV. Additionally, phosphorus doped regions may be formed by doping phosphorous to a concentration of about $5E17/CM^3$ to $1E19/CM^3$ at an energy of about 20 to 50 KeV. The source and drain features 84 may be otherwise formed with other or different dopants, dopant structures, dopant implantation energies or concentrations, or other attributes as needed to optimize performance of the core devices.

Figure 1F:
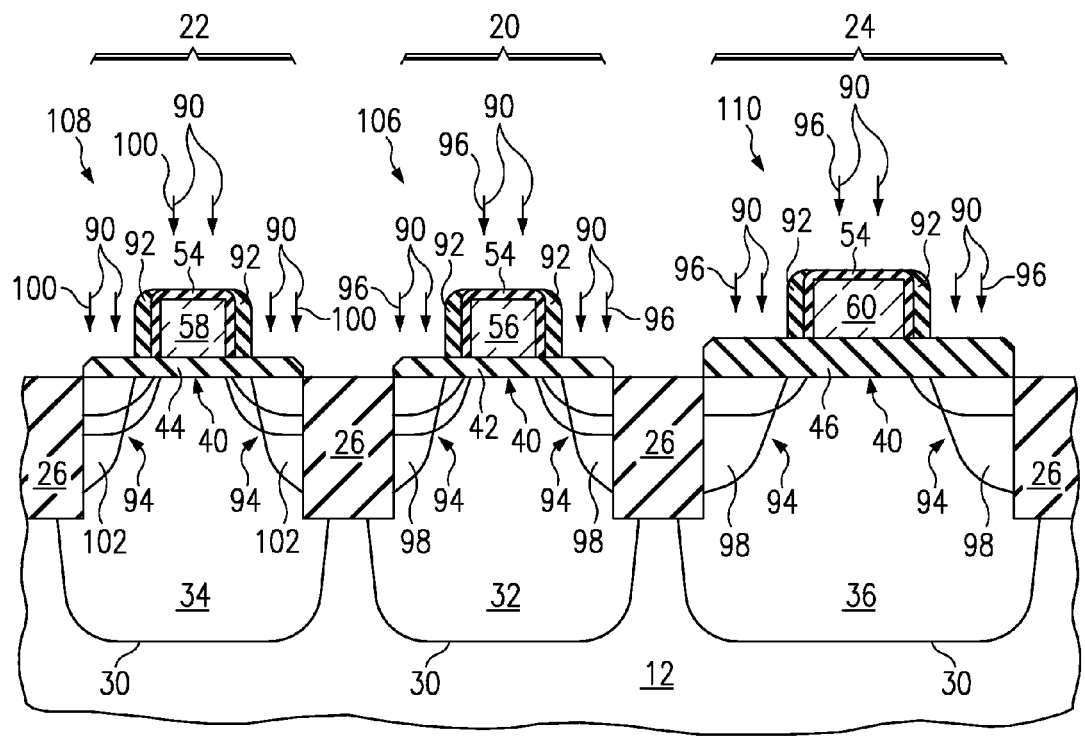

Referring to FIG. 1F, dopants 90 are implanted into the substrate 12 between the isolation structures 26 and device sidewalls 92 to form deep self-aligned sources and drains 94 for the core and input/output devices of the mixed voltage circuit. In accordance with roadmap CMOS, separate mask processes (not shown) are used to form the sources and drains 94 for the complementary devices. Accordingly, for the exemplary MOSFET embodiment, the second region 22 having the pMOS device is masked while the first and third regions 20 and 24 having the nMOS devices are doped with an n-type dopant or dopants 96 to form nMOS source and drains 98. The n-type dopants 96 are arsenic implanted to a concentration of about $1\text{-}2E15/CM^3$ at an energy of about 50 to 100 KeV and phosphorous implanted to a concentration of about $1E13/CM^3$ to $5E14/CM^3$ at an energy of about 20 to 50 KeV. Similarly, the first and third regions 20 and 24 having the NMOS devices are masked while the second region 22 having the pMOS device is doped with a p-type dopant or dopants 100 to form a pMOS source and drain 102. The p-type dopant 100 is preferably implanted to a concentration and at an energy sufficient to counterdope any n-type dopants existing in the pMOS gate 58 as a result of omitting the nMOS implant mask earlier in the fabrication process. In one embodiment, the p-type dopant 100 is boron implanted to a concentration of about $5E19/CM^3$ to $2E20/CM^3$ at an energy of about 5 to 15 KeV.

The device sidewalls 92 are conventionally formed by depositing and etching an oxide, nitride, or other suitable dielectric layer. The dual implant masks are conventional photolithographic masks as previously described in connection with masks 70 and 80. Both the n-type and p-type dopants 96 and 100 are implanted using conventional equipment and techniques.

After formation of the sources and drains 98 and 102 for the nMOS and pMOS devices, source, drain, and gate contacts (not shown) are formed for the devices in accordance with the conventional integrated circuit fabrication techniques. The source and drain contacts may be silicided by removing the reoxidation layer 54 from the sources and drains 98 and 102, depositing titanium, cobalt or other suitable metal for the contact, and reacting the metal with the silicon of the substrate 12 to form a metal silicide connecting the contact to the sources and drains 98 and 102.

The resulting nMOS and pMOS core devices 106 and 108 have low source and drain resistance while the resulting nMOS input/output device 110 has high reliability. Thus, both core and input/output device performance is improved without increasing production costs. Accordingly, a low cost mixed voltage circuit is fabricated with improved device performance.

Although the present invention has been described with several embodiments, various changes and modifications may be suggested to one skilled in the art. It is intended that the present invention encompass such changes and modifications as fall within the scope of the appended claims.

What is claimed is:

1. A mixed voltage circuit, comprising:
   a substrate including a first device, a second device complementary to the first device, and a third device that has a gate dielectric thickness different from the gate dielectric thickness of the first device;
   the first, second, and third devices having gate electrodes all including a first dopant species wherein the concentration of said first dopant species in said gate electrode of said second device is at most about $6 \times 10^{14}/cm^3$; and
   the first and third devices each having disparate source and drain features optimized for the device.

2. The mixed voltage circuit of claim 1, wherein the dopant species is phosphorus.

3. The mixed voltage circuit of claim 1, wherein the devices are complementary metal oxide semiconductor (CMOS) transistors.

4. The mixed voltage circuit of claim 1, wherein the devices are field effect transistors (FET).

5. The mixed voltage circuit of claim 1, wherein the source and drain features for each of the first and third devices include source and drain extensions.

6. The mixed voltage circuit of claim 1, wherein the source and drain features for each of the first and second devices include source and drain extensions and pockets.

7. The mixed voltage circuit of claim 1, wherein the concentration of the dopant species is sufficient to enable a line width measurement for the first gate electrode.

* * * * *